(12) United States Patent
Miyauchi et al.

(10) Patent No.: US 6,561,343 B2
(45) Date of Patent: May 13, 2003

(54) MAGNETIC CARRYING DEVICE

(75) Inventors: Nobuhito Miyauchi, Tokyo (JP); Terushige Takeyama, Tokyo (JP); Takashi Shiba, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/938,486

(22) Filed: Aug. 27, 2001

(65) Prior Publication Data
US 2002/0060134 A1 May 23, 2002

(30) Foreign Application Priority Data
Aug. 29, 2000 (JP) ........................... 2000-259546

(51) Int. Cl.⁷ ............................................ B65G 35/00
(52) U.S. Cl. ................................. 198/619; 198/690.1
(58) Field of Search .................................. 198/619, 690.1, 198/657, 676; 414/217, 218

(56) References Cited

U.S. PATENT DOCUMENTS

| 5,377,816 A | 1/1995 | Deligi et al. |
| 5,402,021 A | 3/1995 | Johnson |
| 5,881,649 A | 3/1999 | Hasegawa et al. |
| 5,906,262 A | 5/1999 | Miki |
| 5,913,401 A | 6/1999 | Tamura et al. |
| 6,206,176 B1 | 3/2001 | Blonigan et al. |

FOREIGN PATENT DOCUMENTS

| GB | 2 165 515 | * 4/1986 | ............... 198/619 |
| JP | 10-159934 | 6/1998 | |
| JP | 10-205604 | 8/1998 | |

* cited by examiner

Primary Examiner—James R. Bidwell
(74) Attorney, Agent, or Firm—Burns, Doane, Swecker & Mathis, LLP

(57) ABSTRACT

A drive member has a spiral magnetic coupling in its upper surface configured from a N pole spiral and a S pole spiral. A carrier can slidably move in the shaft direction to pass through a point that is a fixed distance from the upper surface of the drive member, and a magnetic coupling is provided at an interval the same as the interval between the N pole spiral and the S pole spiral of the spiral magnetic coupling. The carrier is moved directly by the rotational operation of the drive member. The arranged interval (d) of the drive member along a conveying path is a positive integer multiple of twice the interval (p) between the N pole spiral and S pole spiral of the spiral magnetic coupling. The carrier can be moved smoothly and without interruption, even though a transfer part divides the magnetic carrying path between successive chambers.

7 Claims, 6 Drawing Sheets

31: Magnetic coupling part
31a: N pole magnet
31b: S pole magnet
33: Spiral magnetic coupling part
33a: N pole spiral part
33b: S pole spiral part 32: Drive shaft
32-1: First drive shaft
32-2: Second drive shaft
34: Shaft core part
33: Spiral magnetic coupling part
36: Rotation shaft support part 31: Magnetic coupling part
31a: N pole magnet
31b: S pole magnet
33: Spiral magnetic coupling part
33a: N pole spiral part
33b: S pole spiral part

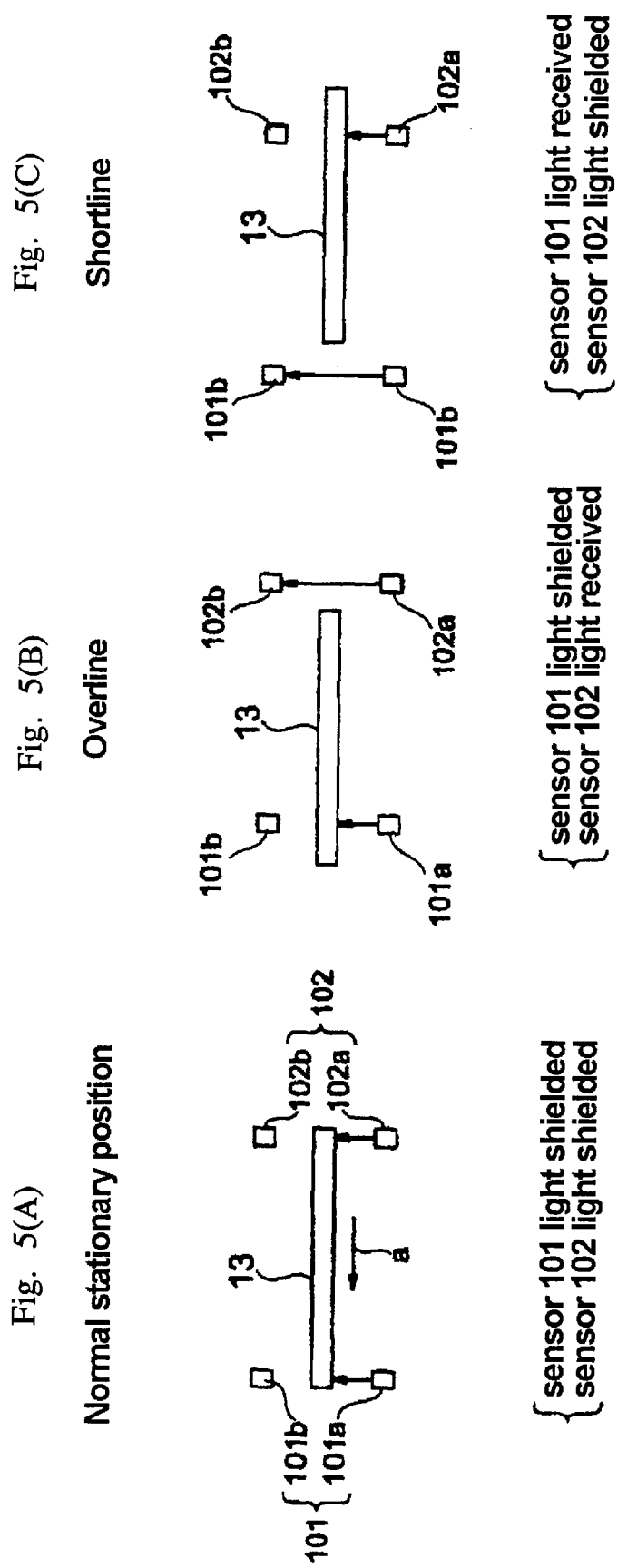

A) Prior to initiation of the operation (position just prior to simultaneous carry)

(B) During transfer to adjacent magnetic coupling part

Synchronizing of drive devices

MAGNETIC CARRYING DEVICE

CROSS-REFERENCE TO RELATED APPLICATIONS

This application claims the priority of Japanese Patent Application No. 2000-259546 filed Aug. 29, 2000 in Japan, the entire contents of which are herein incorporated by reference.

BACKGROUND

1. Field of the Invention

The present invention is directed to a magnetic carrying device and, more particularly, it relates to a magnetic carrying device configured to transmit rotational power using a non-contact method and suitable for a drive mechanism to carry a carrier in a plurality of processing chambers linearly linked in a vacuum atmosphere.

2. Discussion of Related Art

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Previously, contact transmission-type drive mechanisms have carried objects in a vacuum environment using, for example, a rack and pinion mechanism or a roller-type drive method. The friction coefficient in a drive mechanism can be large and a lubricant cannot be used due to the vacuum requirements. As a result, the amount of wear on drive components and the amount of dust generated can deleteriously impact manufacturing operations, particularly in the fields of semiconductors and electronic parts manufacturing.

For example, excessive levels of dust can lower the yield and throughput in the manufacturing of devices. Therefore, it is desirable to maximize the reduction of dust by, for example, minimizing dust generation. Further, with the advent of high speed manufacturing processes, high throughputs, and high-density devices, the demand for low dust production has increased. Additionally, in previous contact mechanisms, clearance between the contacting parts must be large because the friction coefficient is large, thereby limiting the minuteness of the operations that may be performed.

A non-contact type carrying system can be used to reduce dust. Amongst the various methods proposed to reduce dust, the use of magnetic coupling action (hereinbelow referred to as a "magnetic carrying device") is comparatively simple. A combined spiral magnetic circuit and magnetic pole is disclosed in U.S. Pat. No. 5,377,816. In addition, Japanese Unexamined Patent Application No. Heisei 10-205604 discloses, a magnetic carrying device for carrying a carrier without contact.

However, when a carrier on a magnetic carrying device passes through a plurality of processing chambers, generally separated by a gate linking structure, the drive shaft which carries the carrier is separated by partition sections (partition valves) corresponding to each processing chamber and the magnetic circuits between the drive shafts must be synchronized. Therefore, although the problems of wear and dust generation can be reduced by the previous magnetic carrying device compared to a contact transmission method, the synchronizing operation between the carrier magnet and the position of the drive shafts of adjacent processing chambers is difficult.

Japanese Unexamined Patent Application No. Heisei 10-159934, discloses a method for the smooth transfer of a carrier between a plurality of vacuum processing chambers separated and directly connected with a linking part. A rotation drive device with a magnetic coupling part divided into a fixed section and mobile section, absorbs the disparity between the drive shafts of adjacent processing chambers. The disclosed device has a drive power transmission using a bevel gear mechanism, and has a carry speed based on a rotation of the order of 2000 pps (pulse per sec: 500 pps/1 rotation, at 4 rotations/second) acts as a drive power transmission.

However, in recent years, high speed thruput has increased and highspeed magnetic carrying devices now perform at 10000 pps or above. At such high speeds, a condition occurs in which the magnetic coupling does not maintain the necessary speed in the direction of transport and magnets of the same polarity can come into proximity with each other. Under such conditions, the magnets repel each other, the carrier is stopped, and hunting (vibration) occurs between the carrier and the rotation drive device for the adjacent processing chamber. This hunting is a factor in the unsettling of the carrier leading to, for example, the object for processing falling off the mount, both magnetic coupling sections losing magnetism, or the generation of disparities in the stationary position of the carrier in the processing chamber.

Further, in the divided spiral magnetic coupling, smooth operation is maintained by the use of grease frequently applied on the slide part, which negatively impacts productivity and operations.

OBJECTS AND SUMMARY

An object of the present invention is to provide a magnetic carrying device that is particularly suited for application in a semiconductor manufacturing device or electronic part manufacturing device or the like which comprises a plurality of chambers connected in parallel. The magnetic carrying device is designed to transport carriers between adjacent processing chambers smoothly and continuously at high speed, thereby improving productivity.

According to one embodiment of the present invention, a magnetic carrying device is provided for carrying an object to be processed through a plurality of chambers that are separated from each other by an openable linking part. The magnetic carrying device comprises a carrier having a plurality of carrier magnetic coupling parts at a slide end; a rotating drive member arranged in each of the plurality of chambers, each rotating drive member having an outer surface with a spiral magnetic coupling part having a N pole spiral part and a S pole spiral part, the N pole spiral part being arranged at a first interval from the S pole spiral part; a drive device; a power transmission part arranged to transmit a drive force from the drive device to the rotating drive members; the carrier magnetic coupling parts being spaced from each other a distance substantially equal to the first interval; a guide device slidably supporting the carrier along a path at a spaced relationship from the rotating drive members so that the carrier is moved along the guide device by a rotating motion of the rotating drive members; a control member provided to synchronously control the rotating drive members to provide a continuous operation of the carrier between the chambers; wherein the rotating drive members are spaced from each other at intervals equal to a distance defined by 2 X the first interval X a positive whole number integer.

In another aspect of the invention, the rotating drive members may be exterior to the chambers.

Furthermore, the spacing of the rotating drive members may have an acceptable tolerance of ±1.5 mm.

In a further aspect of the invention, each of the rotating drive members may be divided into a first section and a second section and the power transmission part may be disposed between the first section and the second section.

In addition, the drive device may be a pulse motor and the control member controls an operation of the pulse motor by pulse number control.

A matching of the rotating drive members may have a total disparity of ±30° or a matching of the rotating drive members may have a total disparity of ±18.2°.

BRIEF DESCRIPTION OF THE DRAWING FIGURES

Other objects and advantages of the invention will become apparent from the following detailed description of preferred embodiments in connection with the accompanying drawings in which like numerals designate like elements and in which.

Figure 6A:
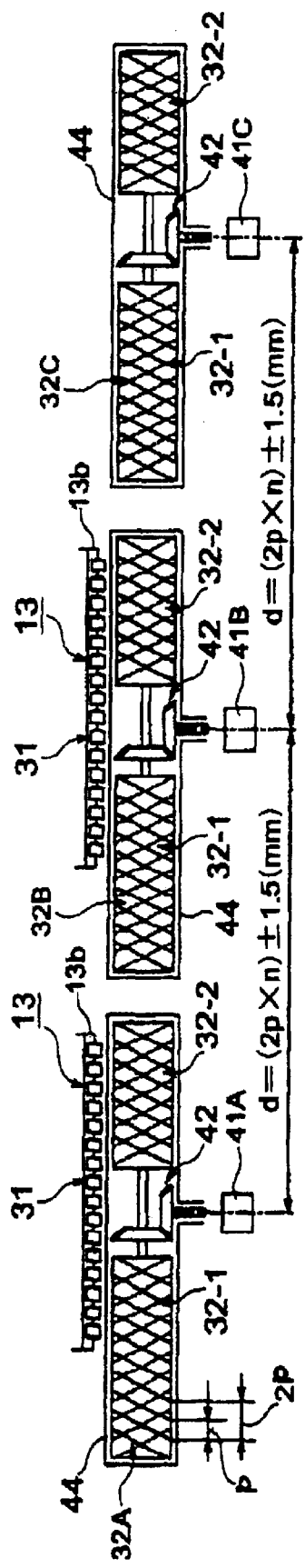
Figure 6B:
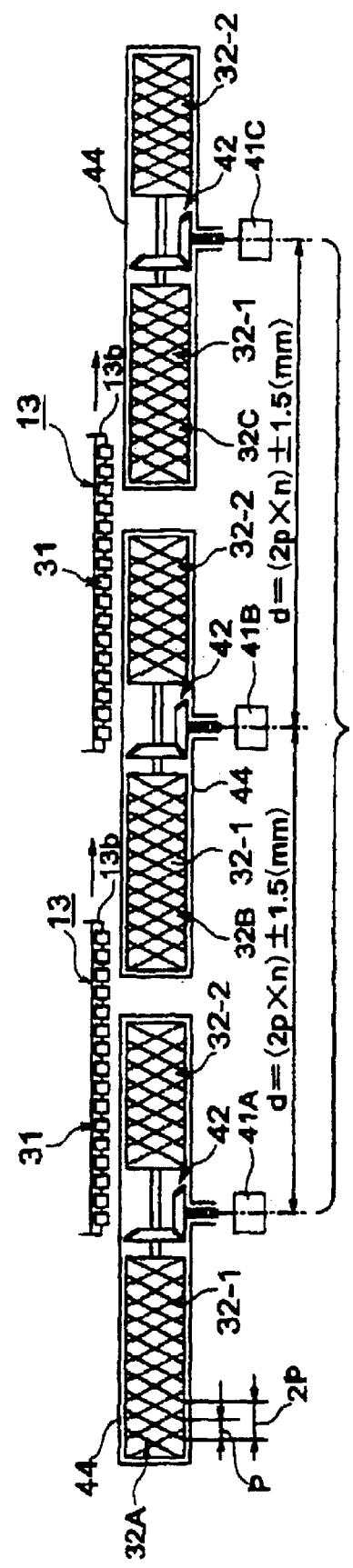

FIGS. 5(A), 5(B), and 5(C) are examples of the configuration of a sensor mechanism; and FIG. 6(A) is a diagram of the drive shaft in each chamber prior to initiation and FIG. 6(B) shows transfer of a carrier.

DETAILED DESCRIPTION OF THE PREFERRED EMBODIMENTS

Figure 1:
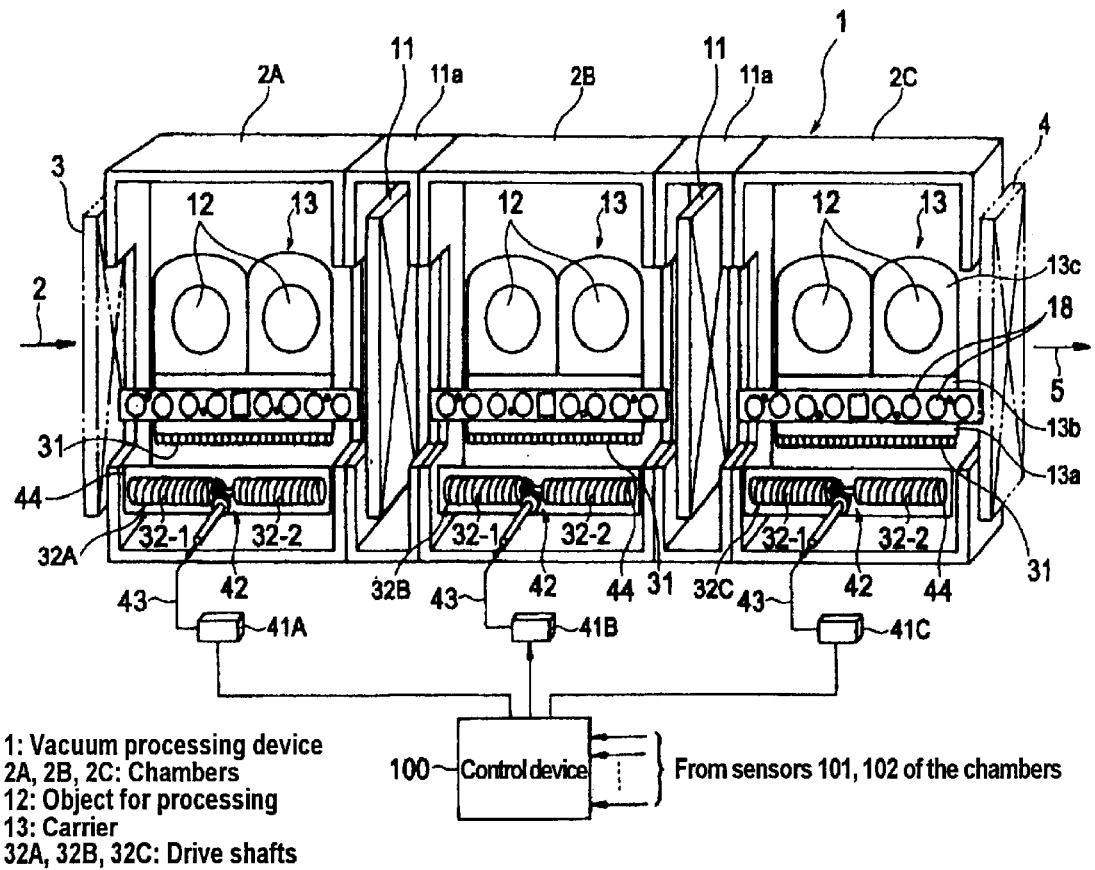
FIG. 1 is a perspective view of an inner configuration of a vacuum processing device including a magnetic carrying device.
Figure 2:
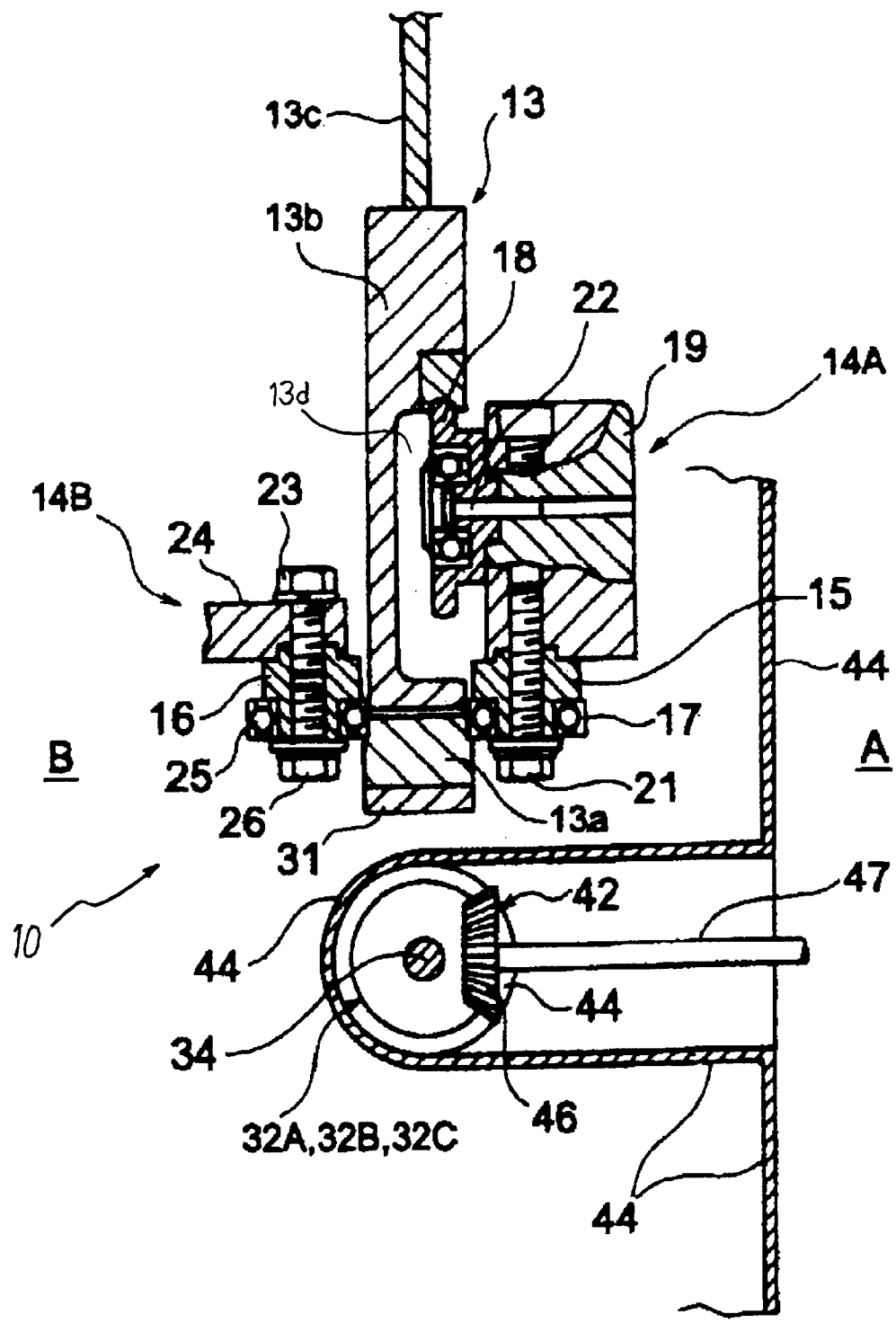
FIG. 2 is a cross-sectional view of the structure of a guide device.

FIG. 1 is a perspective view of the inner structure of a vacuum processing device 1 detailing the inner structure, as seen from the rear, including the configuration of a guide device 10 (FIG. 2). The vacuum processing device 1 can be a dual-surface processing device, used, in sputtering processing or PCVD processing, or the like. Although other types of processing, such as single surface processing or rotational process, and other processing techniques, such as other physical or chemical deposition techniques, can be utilized.

In the exemplary embodiment of FIG. 1, a vacuum processing device 1 comprises three chambers (alternatively called partitioned rooms) 2A, 2B, 2C, separated by a partition valve 11 such as a gate valve housed in a partition valve chamber 11a. The number of chambers that are shown represents an example only and is not limited to three. The interiors of the chambers 2A, 2B, 2C are vacuum-exhausted by an independent exhaust system (not shown in the diagram).

In operation, carrier 13 which can be configured to carry an object for processing 12 is sequentially carried into the chambers 2A, 2B, 2C, passing through the partition valves 11 which, when open, interconnect adjacent chambers. At a fixed position, which can be any desired position, the carrier can be stopped and a processing operation performed. The same or different processing operations can be performed in each chamber. The carrier 13 is moved by a guiding action in accordance with the guide device 10. In FIG. 1, by way of example, carrier 13 passes from the exterior through a carry-in valve 3 into the first chamber 2A of the vacuum processing device 1. After passing through chambers 2A, 2B, 2C and completing various processing operations, the carrier is passed through a carry-out valve 4 to the exterior, as shown at arrow 5.

FIG. 2 is a cross-sectional view of the carrier 13 and the guide device 10. Carrier 13 comprises a slide 13a provided in the lower side of a base 13b, and a support plate 13c that supports the object for processing 12 in a desired position. The base 13b has a hollow 13d that is substantially a concave-like portion resulting in an area of reduced cross-section. A magnetic coupling part 31 of a predetermined polarity is disposed at a distal end of the slide 13a. For example, two circular attachment holes can be formed in the front and rear positions of the support plate 13c and the object for processing 12 is a circular plate substrate that is fitted into the attachment hole and fixed with a hook-like fixture. In a second example, two objects to be processed 12 are attached in a vertical position in the support plate 13c and processed on both sides simultaneously or independently. As shown in FIG. 1 and FIG. 2, the carrier 13 is arranged substantially vertically, although any suitable orientation can be employed depending on the process to be performed and the object to be processed.

Guide device 10 comprises principal guide mechanism 14A and an auxiliary guide mechanism 14B is disposed in chambers 2A, 2B, 2C adjacent the path of travel of the carrier 13 and on opposing sides of slide 13a and base 13b. Linear rail members 15, 16 are disposed in both the principal guide mechanism 14A and auxiliary guide mechanism 14B, respectively, and are arranged facing the direction of transport of the carrier 13. The two carrier guide rail members 15, 16 are parallel to the side surface position of the carrier 13 and are of a linear guide pole-like mode.

In the principle guide mechanism 14A, a plurality of guide bearings 17 are disposed using bolts 21 located at fixed intervals along the length of the lower surface of the rail member 15. The guide bearings 17 are provided such that the bearing outer surface abuts the side surface of the slide 13a of the carrier 13. The guide bearings 17 are deployed in such a way as to, by way of example, rotate within the horizontal plane in FIG. 2. A plurality of guide rollers 18 are disposed using bolts 22 located at fixed intervals along the length of the upper side surface opposing the carrier 13. The guide rollers 18 are rotatably attached to an attachment member 19 provided in the rail member 15 of the principal guide mechanism 14A. The guide rollers 18 are arranged in such a way as to support the upper edge of the hollow 13d formed in the side surface of the base part 13b. The guide rollers 18 are deployed in such a way as to, by way of example, rotate within the vertical plane in FIG. 2.

In the auxiliary guide mechanism 14B, the rail member 16 is fixed to a support frame 24 by a bolt 23. A plurality of guide bearings 25 are disposed using bolts 26 located at fixed intervals along the length of the lower surface of the rail member 16. The guide bearings 25 are provided in a position such that the bearing outer surface abuts a side surface of the slide 13a of the carrier 13. The guide bearings 25 are deployed in such a way, as to, by way of example, rotate within the horizontal plane of FIG. 2.

Based on the above configuration, because of the relationship between the guide device 10 of each chamber and the carrier 13, the slide 13a of the carrier 13 is supported on both sides by the guide bearing 25 of the auxiliary guide mechanism 14B and the guide bearings 17 of the principal guide mechanism 14A. The base part 13b of the carrier 13 is supported by the guide rollers 18 in the hollow 13d support of the principal guide mechanism 14A.

The guide device 10, which comprises the principal guide mechanism 14A and the auxiliary guide mechanism 14B, is provided separately for each of the chambers 2A, 2B and 2C. Accordingly, the rail members 15, 16 of the guide devices, are discontinuous between adjacent chambers 2A, 2B and 2C across the partition plate 11 and partition chamber 11a.

Drive devices 41A, 41B, 41C are provided in the chambers 2A, 2B, 2C for transporting the carrier 13 in the chamber. A drive device 41A, 41B, 41C can be, for example, a pulse motor or other suitable device which can operate the magnetic carry mechanism in the desired manner and sequence to move the carrier 13. For example, the carrier 13 enters the chamber 2A through an entrance part and is fed through the appropriately opened partition plates 11 by the above-noted drive devices 41A, 41B, 41C and magnetic carry mechanism. In FIG. 1, the sequence of the chambers is 2A, 2B, 2C. In the chambers 2A, 2B, 2C, a predetermined processing is administered on the object 12, while the carrier 13 is either stationary or moving. After the series of processing steps is completed, the carrier 13, is taken out though an exit part of the chamber 2C.

Rotating drive members (hereinbelow referred to as "drive shafts" ) 32A, 32B, 32C, which have a columnar or cylindrical shape, are disposed, outside the vacuum environment of the corresponding chamber. The drive shafts are in each chamber 2A, 2B, 2C and rotatably supported at each end to rotate about the shaft axis. The drive shaft 32A, 32B, 32C can be divided and arranged in two parts. For example, the rear and front of the shaft can be divided into a first drive shaft 32-1 and second drive shaft 32-2. The two-part drive shaft has a rotating force imparted to the drive shaft at substantially the center of its length. As is shown in FIG. 1 and FIG. 2, a rotating transmission part 42 can be provided in a center section of the two-part divided drive shafts 32A, 32B, 32C. A rotating force 43 is imparted from the drive devices 41A, 41B, 41C to each of the rotating transmission parts 42. The drive shafts 32A, 32B, 32C are rotated by the imparting of a rotating force 43 from the drive devices 41A, 41B, 41C. Rotation may be either clockwise or counterclockwise to conform to the desired direction for transporting the carrier.

A spiral magnetic coupling is formed in the upper surface on the outer circumference of the first drive shaft 32-1 and second drive shaft 32-2. The period of the magnetic coupling is maintained along the entire length of the divided drive shaft by, for example, sizing any interruption in the upper surface of the drive shaft to be a positive integer multiple of the period of the polarity of the spiral magnetic coupling. The drive shafts 32A, 32B, 32C impart a drive force on the magnetic coupling part 31 thereby slidably moving the slide part 13a and by extension carrier 13 linearly along the rail members 15, 16 of the principal guide mechanism 14A and auxiliary guide mechanism 14B.

As shown in FIG. 2, the drive shafts 32A, 32B, 32C are disposed in the atmospheric environment outside the chambers 2A, 2B, 2C and are separated from the chamber environment by a cover 44 made of SUS, or any other suitable material. The cover 44 forms a boundary that divides the vacuum and atmosphere. The cover 44 can be provided with a housing section located about the protrusion of the drive shaft into the evacuated portion of the chamber. The housing section can be tubular in shape or any other suitable form. In a tubular shape, the center of said tubular section forms a space for the deployment, and removal to the atmospheric side, of a rotating shaft 47 that includes a bevel gear 46 at a first end. Alternatively, the drive shafts 32A, 32B, 32C can be within the same vacuum chamber as the carrier 13 or the like.

An exemplary embodiment can be an inline type device with a carrier 13 on which, for example, two objects for processing 12 are mounted and carried along the rail members 15, 16 of the guide device 10. Accordingly, in an inline type device, drive devices 41A, 41B, 41C are controlled in each of the chambers 2A, 2B, 2C to simultaneously transport a carrier 13 by the synchronous rotation of the drive shafts 32A, 32B, 32C. In FIG. 1, a control device 100 performs the control of the drive devices 32A, 32B, 32C. In a preferred embodiment, it is preferable that the drive devices 41A, 41B, 41C be synchronized such that the disparity of the rotating angle of the drive shafts 32A, 32B, 32C be controlled to within ±2°. This ±2° is the value of the angle which is permissible as a synchronized disparity between adjacent drive devices and has its origins in the synchronized control. This ±2°, is the value obtained through actual measurement.

Sensors 101, 102 can be provided in each of the chambers 2A, 2B, 2C to detect the presence of a carrier 13 in the set position and to forward the position information to the control device 100. Based on data relating to the state of the carrier, the control device 100 performs the control described below.

Examples of sensors 101, 102 are shown in FIG. 5 in which carrier 13 is transported from the right toward the left as indicated by arrow a. FIG. 5(A) shows the deployed state of the sensor with respect to a carrier 13 and, by way of example, the normal stationary position of the carrier 13 in the chamber. By way of example, the sensors 101, 102 can be transmission-type photoelectric sensors. A sensor 101, comprising a light generating unit 101a and light-receiving unit 101b, and a sensor 102 comprising a light-emitting unit 102a and light-receiving unit 102b, are arranged in a position each opposing one end part of the carrier 13. Sensor 101 is located downstream of sensor 102. When there is no light-shielding material interposed, that is to say, a carrier 13, between the single group of sensors 101, 102, the light is transmitted and, where a light-shielding interposed material is present, light is not transmitted. In FIG. 5, the arrow shows the light emitted from the light-emitting units 101a, 102a. It is understood that, when both sensors 101, 102 are in a shielded state, as in FIG. 5(A), the control device 100 is in its normal position. In the case in which the carrier is over the set position (when overline), as in FIG. 5(B), or, when the carrier does not reach the normal position (when shortline), as in FIG. 5(C), the carrier 13 is not present between both of the 2 groups of sensors and so the light will be transmitted by at least one of the sensors 101,102. A detection signal is issued from the sensors 101, 102 in this state and the control device 100 adjudges this to constitute an abnormal position state.

When a basic mode is adopted in which there is no feed-back from the drive devices 41A, 41B, 41C, a disparity can be generated between the number of rotations related to the distance to be moved and the number of rotations related to the actual distance that is moved, that is to say, the carry distance. Thereupon, in one aspect, a pulse motor is employed which operates, based on feed back, in such a way that the command signal issued for rotation of the motor and the actual number of rotations of the motor are coincident. By the employment of a pulse motor such as this and in the case in which the carry speed is a high speed, the difference between the number of rotations related to the distance that should be moved and the number of rotations related to the distance that is actually moved can be alleviated.

Figure 3:
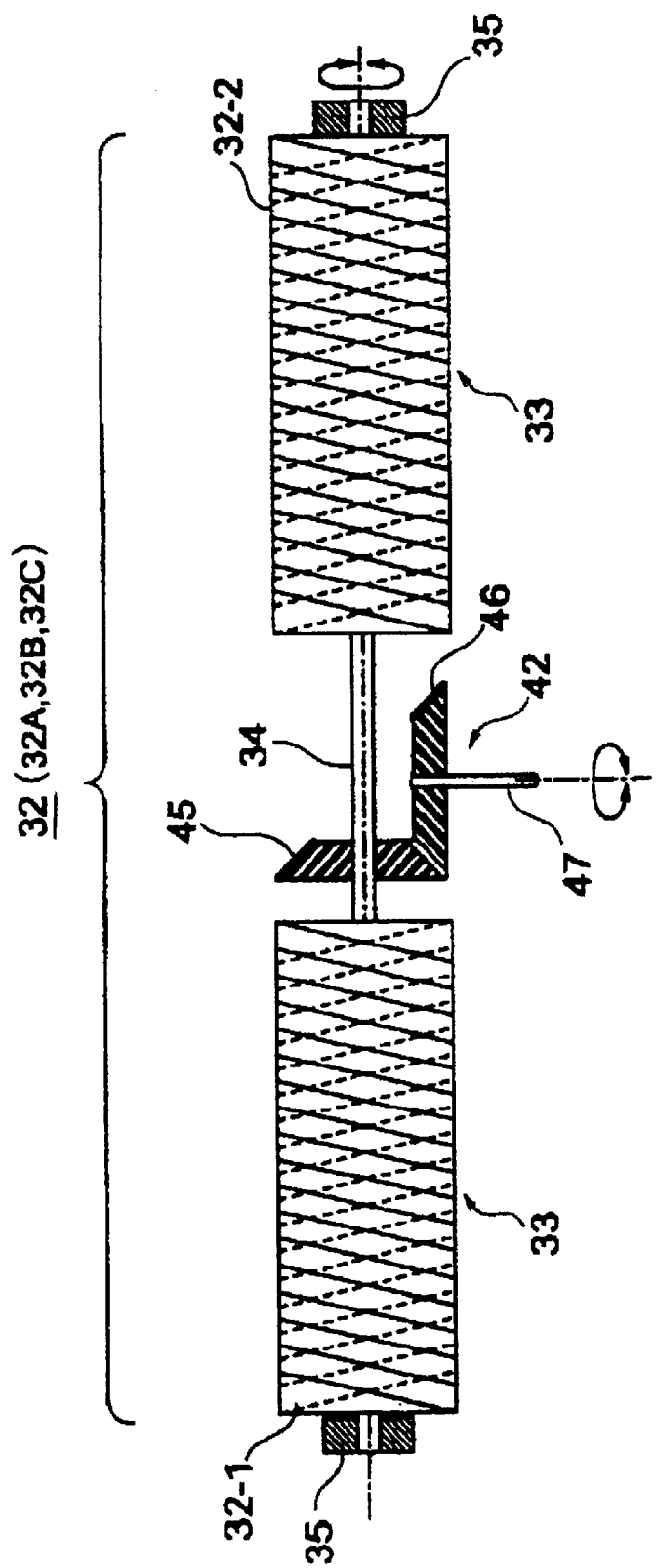
FIG. 3 is a partial cross-sectional plan view of a drive shaft and a power transmission part.

FIG. 3 shows an expanded view of the drive shafts 32A, 32B, 32C. In FIG. 3, collectively the drive shafts 32A, 32B, 32C will be generically referred to as the drive shaft 32 because the drive shafts 32A, 32B, 32C in the present embodiment have an identical structure, and the description thereof will be given using the drive shaft 32 as an example.

In FIG. 3, first drive shaft 32-1 and second drive shaft 32-2 of the drive shaft 32 are fixed to a common shaft core 34 and are supported at both ends of the shaft core 34 by a rotatable shaft support 35. The first and second drive shafts 32-1 and 32-2 have two operating modes. In a first mode, an action in accordance with the magnetic coupling action between the magnetic coupling part 31 of the slide 13a and the spiral magnetic coupling part 33 of the surface of the drive shaft 32 causes the carrier 13 to be moved in a desired direction. In a second mode, a stationary position of the carrier 13 within the corresponding chamber is established.

Figure 4:
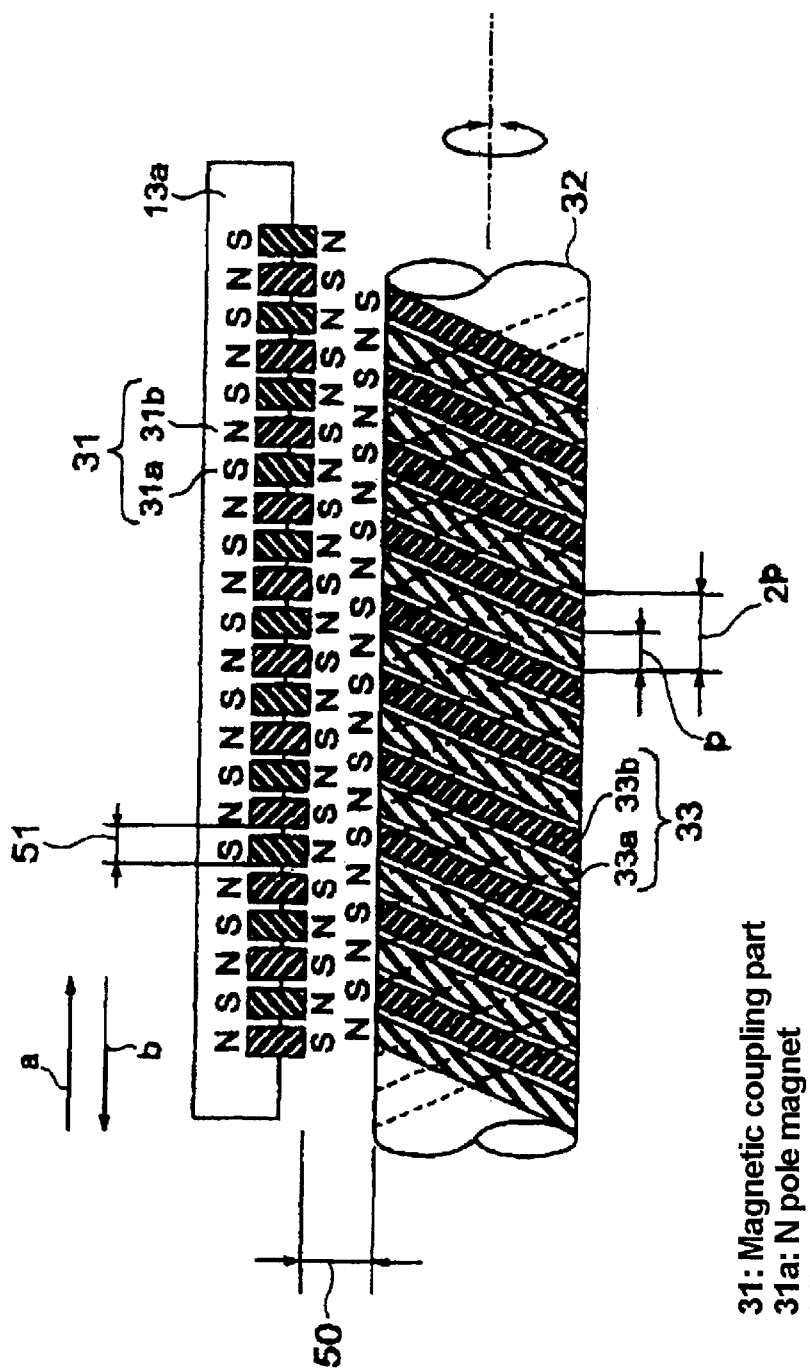
FIG. 4 shows diagrammatic relationship between a spiral magnetic coupling part of the drive shaft and a magnetic coupling of the slide part.

FIG. 4 is a diagram that shows the relationship between the spiral magnetic coupling part 33 in the drive shaft 32, which uses a magnetic action, and a magnetic coupling part 31 provided in the lower surface of the slide 13a of the carrier 13. Power from drive devices 41A, 41B, 41C is transmitted by a rotational power transmission 42 configured from the assembly of two bevel gears 45, 46 provided between the first drive shaft 32-1 and second drive shaft 32-2 of each of drive shaft 32. The bevel gear 45 is fixed to the shaft core 34, and the bevel gear 46 is fixed to the rotation shaft 47. The rotational power imparted from the drive device 41 is transmitted to the shaft core 34 by way of the rotation shaft 47 and the rotational power transmission 42 and, as a result, the shaft core 34 is rotated. The direction of rotation is arbitrary, and the carrier 13 can be moved in either the a or b direction by the selection of the direction of rotation.

FIG. 4 also shows the magnetic coupling part 31 of the slide 13a and the spiral magnetic coupling part 33 of the surface of the drive shaft 32 in a magnetically coupled state. The spiral magnetic coupling part 33 is disposed on the surface in a spiral shape at a suitable pitch. The spirals that are drawn in the surfaces of the first drive shaft 32-1 and second drive shaft 32-1 are formed so as to be connecting. The spiral magnetic coupling part 33 is magnetized in a double-layer band-like spiral shape in such a way that the N-pole spiral 33a and S-pole spiral 33b alternate. Meanwhile, the above-described magnetic coupling part 31 is provided in the opposingly deployed slide 13a in such a way that, preferably, a gap 50 is formed with the drive shaft 32. A plurality of hollows are formed in the surface of the slide 13a by gaps 51 that are equivalent to the N pole spiral 33a and S pole spiral 33b. Magnets of predetermined polarity are alternately embedded in these respective hollows to form the magnetic coupling part 31. For example, the N pole opposing surface of the magnetic coupling part 31 is referred to as the N pole magnet 31a, and the S pole opposing surface of the magnetic coupling part 31 is referred to as the S pole magnet 31b.

As shown in FIG. 4, a desired interval (pitch) p is set between the N pole spiral 33a and S pole spiral 33b of the spiral magnetic coupling part 33. In addition, the gaps 51 between the N pole magnet 31a and S pole magnet 31b are set in such a way as to be equivalent to the interval p. Although the spiral magnetic coupling part 33 is configured in a double spiral of an N-pole spiral and S pole spiral, it is not limited to this configuration and may, by way of example, be configured as a four-layer spiral, i.e., N, S, N, S.

As is shown in FIG. 4 and FIG. 6, a magnetic attraction and coupling occurs between the different and opposing N-pole spiral 33a and S pole spiral 33b formed on the surface of the first drive shaft 32-1 and second drive shaft 32-2 and the N pole magnet 31a and S pole magnet 31b of the slide 13a of the carrier 13. When the drive shaft 32 is rotated, the pole types of the spiral magnetic coupling part 33 oppose the magnetic coupling part 31 and correspondingly move such that the slide 13a and the carrier 13 integrated therewith are moved.

To accommodate the partition valves 11, a transfer section is present between adjacent chambers. Consequently, drive shafts 32 in adjacent chambers are not continuous across the transfer the section. See, for example, the drive shaft 32A arranged in the chamber 2A and the drive shaft 32B arranged in the chamber 2B. In order for a carrier 13 to be moved smoothly through the transfer section and synchronously and simultaneously to the next adjacent chamber, special conditions in terms of the configuration of the arranged position of the drive shafts 32A, 32B, 32C can be provided so as to afford the matching of the drive shafts 32.

FIG. 6 depicts an example of the operation of a magnetic carrying device that has the above-described configuration. The depiction illustrates the conditions and the configurations that enable a plurality of carriers to be simultaneously carried and the matching that affords the carriers to be smoothly carried across the transfer sections.

Interval d between the adjacent drive shafts 32A, 32B, 32C is preferably set at as a positive integer multiple of 2 times p, that is to say, such that d =2p ×n (where n is the desired positive integer multiple, p is the pitch, and d the interval); p and 2p, and d are as shown in FIG. 6. By satisfying the relationship, the carriers 13 present in the chambers 2A, 2B, 2C are moved smoothly across the transfer sections 11a to the next chamber and can be synchronously and simultaneously carried.

However, mechanical assembly errors and the like result in a disparity from the design condition and require the magnetic carrying device to operate properly within a tolerance range of permissible values. For example, the arranged interval of the drive shafts 32A, 32B, 32C can be converted to the rotational angle disparity of said drive shafts. Matching can be performed if the maximum rotational angle disparity is preferably approximately 60° or less. Defined in relation to the ideal matched state, the permissible range is ±30°. The reasons for such "disparity" can include the precision of the arranged intervals between the chambers related to the consecutively disposed drive shafts, i.e., 32A to 32B, the synchronous disparity arising from the synchronous control of the adjacent drive devices, and the back-rush of the gears in the power transmission mechanism. As a best mode, it is preferable that, with regard to the actual measurement of the amount of disparity, the amount of disparity due to the precision of the arranged intervals be ±14.2°, the amount of disparity due to synchronous disparity be ±2°, and the amount of disparity due to back-rush be ±2°. Therefore, the total disparity of the best mode is ±18.2°. It should be understood that if the overall amount of disparity is within a range of ±30°, smooth transfer can be performed.

As a further example, in a typical embodiment, the N pole spiral 33a or the S pole spiral 33b of the drive shafts 32A, 32B, 32C are designed such that one rotation of the drive shaft converts to a distance in the direction of the shaft of 38 mm. In other words, when the carrier 13 is moved forward 1 mm for example, the drive shafts have been rotated approximately 9.5°. Considering the above-noted permissible range of ±30° a converted distance of approximately 3.16 mm is determined. Furthermore, the range of 14.2° represents a distance of approximately 1.5 mm, and ±18.2° represents a distance of approximately 1.92 mm. If the preferable range of disparity of the best mode is expressed in distance, i.e., is ±1.92 mm or less, the matching relating to the precision of the arranged interval of the drive shafts 32A, 32B, 32C can be adequately performed. Furthermore, it is preferable, if the precision of the arranged interval of the drive shafts is only to be considered, that the distance be within the range of ±1.5 mm. It will be noted that, based on the above-noted relationship, p is equivalent to 9.5 mm and 2p is equivalent to 19 mm.

Interval d is preferably set, at a precision of ±1.5 mm or less (rotational angle of the drive shaft ±14.2° or less). As a result, synchronized carrying can be performed when simultaneously carrying a plurality of carriers. In FIG. 6, the (2p×n) ±1.5 mm related to the interval d indicates a preferable design method. By satisfying the above-noted conditions for the arranged position of the drive devices 32A, 32B, 32C, smooth synchronized carrying can be performed without the need for special preparatory phase matching control, and furthermore, without the special provision of a disparity absorbing moveable drive shaft structural part.

The above discussion on pitch and distance has been illustrative. It is to be understood that if the scale of the device and the scale of the drive shaft and other components are changed, the numerical value of the permissible range for the relationship formula of the interval d will change in response thereto.

As is shown in FIG. 6(A), when the arranged interval d and arranged interval p are maintained in the prescribed relationship, the carriers 13 present in the chambers 2A, 2B are in identical positions with respect to the drive devices 32A, 32B prior to the initiation of simultaneous carry. Accordingly, there is no disparity in the movement phase for carry between the chambers, and the initial positions for carry are matching. For this reason, with regard to the control of the control device 100 that affords the operation of the drive devices 41A, 41B, 41C, even if the drive power transmission to the drive shafts is initiated simultaneously for each chamber (even if synchronous control is performed), a matching between the positions of the spiral magnetic coupling 33 of the drive shaft of the next adjacent chamber, and of the magnetic coupling 31 (N pole magnet 31a, S pole magnet 31b) of the slide 13a for the carrier 13 which has been moved from the previous chamber, can be performed. That is to say, smooth transfer of the carrier 13 can be performed because the position of sections of different polarity between the spiral magnetic coupling part 33 of the drive shaft of the next chamber, and the magnet 31a, 31b of the slide 13a of the carrier 13 which has been moved from the previous chamber, are formed to be matching and opposing. In addition, the transfer can be performed smoothly even at high speed because, as is described above, the arrangement is one of high precision. Although the device is effective at a speed of 10000 pps or above, it goes without saying that transfer can also be performed effectively at low speeds. Accordingly, based on this configuration, no vibration (hunting) or carrier interruption occurs as a result of the retreat of the carrier 13 due to repulsion magnetic poles of the same type.

In a specific embodiment, the optimum interval p is, by way of example, 9.5 mm. However, this numerical value, which is not limited to this value, is determined in accordance with the scale and so on of the device configuration.

In one aspect, the drive shaft 32 is formed as a two-part divided configuration with a first drive shaft 32-1 and second drive shaft 32-2. However, the drive shaft 32 need not always be divided into two parts, and the formation of a drive shaft 32 in a single body is also possible. In this case, it is preferable that rotational drive power be imparted from the end part of the drive shaft 32.

In a vacuum processing room configured by the provision of three or more chambers separated and linearly connected by a linking part and provided with carriers on which an object for processing is mounted, can simultaneously, continuously, and smoothly carry the plurality of carriers by forming an interval (d) between the drive shafts which establishes the position of the carrier in the chamber, to be a positive integer multiple of 2 times p, i.e., n (2× the interval (p) of the N pole spiral and S pole spiral of the spiral magnetic coupling part 33).

The permissible range of interval d of the drive shaft can be preferably ±1.5 mm. Furthermore, the total disparity, which includes the precision of the arranged interval of the drive shafts, is preferably within the range of ±30°, most preferably ±18.2°.

By the present invention, simultaneous and continuous carrying of a plurality of objects for processing can be performed. By satisfying conditions such as the matching of the magnetic phase relationship of the spiral magnetic coupling of the rotating drive member and the magnetic coupling of the slide prior to drive initiation for simultaneous carry, smooth carry is possible in which there is little vibration in the transfer across the transfer sections of adjacent chambers.

Furthermore, in accordance with the present invention, the smooth transfer of carriers, which are preferably carried at high speed, can be performed between a plurality of vacuum processing chambers separated and linearly connected by a linking part. An improvement in reliability of the slide movement and an increase in carrying speed are achieved and, as a result, the problem of magnetic loss of the magnetic coupling can be reduced. Furthermore, because the drive shafts in the rotation drive member do no require grease, the time required for the maintenance pertaining thereto is omitted and productivity is improved.

The magnetic carrying device pertaining to the present invention, which has application in, by way of example, vacuum processing devices for processing such as film deposition on a substrate, is used as a mechanism for transporting a carrier on which a substrate is mounted (substrate tray). As an example, the magnetic carrying device can be in a load lock-type vacuum processing device configured by the connection, in parallel, of a plurality of vacuum chambers.

Although the present invention has been described in connection with exemplary embodiments thereof, it will be appreciated by those skilled in the art that additions, deletions, modifications, and substitutions not specifically described may be made without departing from the spirit and scope of the invention as defined in the appended claims.

What is claimed is:

1. A magnetic carrying device for carrying an object to be processed through a plurality of chambers that are separated from each other by an openable linking part, the magnetic carrying device comprising:

a carrier having a plurality of carrier magnetic coupling parts at a slide end;

a rotating drive member arranged in each of the plurality of chambers, each rotating drive member having an outer surface with a spiral magnetic coupling part having an N pole spiral part and an S pole spiral part, the N pole spiral part being arranged at a first interval from the S pole spiral part;

a drive device;

a power transmission part arranged to transmit a drive force from the drive device to the rotating drive members;

the carrier magnetic coupling parts being spaced from each other a distance substantially equal to the first interval;

a guide device slidably supporting the carrier along a path at a spaced relationship from the rotating drive members so that the carrier is moved along the guide device by a rotating motion of the rotating drive members;

a control member provided to synchronously control the rotating drive members to provide a continuous operation of the carrier between the chambers;

wherein the rotating drive members are spaced from each other to define a pitch of 2 X the first interval X a positive whole number integer;

wherein each of the rotating drive members is divided into a first section and a second section and the power transmission part is disposed between the first section and the second section.

2. The magnetic carrying device of claim 1, wherein the rotating drive members are exterior to the chambers.

3. The magnetic carrying device of claim 1, wherein the pitch of the rotating drive members has an acceptable tolerance of ±1.5 mm.

4. The magnetic carrying device of claim 1, wherein the drive device is a pulse motor.

5. The magnetic carrying device of claim 1, wherein a matching of the rotating drive members may have a total disparity of ±30°.

6. The magnetic carrying device of claim 1, wherein a matching of the rotating drive members may have a total disparity of ±18.2°.

7. The magnetic carrying device of claim 4, wherein the control member controls an operation of the pulse motor by pulse number control.

* * * * *